United States Patent [19]

Pest

[11] 4,312,024

[45] Jan. 19, 1982

[54] FIXED ADJUSTED FLAT CAPACITOR

[75] Inventor: Jurgen Pest, Lynchburg, Va.

[73] Assignee: General Electric Company, Lynchburg, Va.

[21] Appl. No.: 143,195

[22] Filed: Apr. 24, 1980

[51] Int. Cl.³ .......................... H01G 4/40; H01G 7/00
[52] U.S. Cl. .................... 361/271; 361/303; 361/330
[58] Field of Search ................... 361/330, 303, 271; 29/25.42

[56] References Cited

U.S. PATENT DOCUMENTS

| 942,620 | 12/1909 | Dearlove | 361/330 |
|---|---|---|---|
| 2,139,453 | 12/1938 | Linder | 361/303 |
| 2,405,529 | 8/1940 | Smith | 361/303 X |
| 3,402,448 | 9/1968 | Heath | 361/271 X |
| 3,821,617 | 6/1974 | Shelby | 361/303 |
| 4,161,766 | 7/1979 | Castleberry | 361/330 X |

FOREIGN PATENT DOCUMENTS 394214  4/1924  Fed. Rep. of Germany ...... 361/330

Primary Examiner—Elliot A. Goldberg
Attorney, Agent, or Firm—James J. Williams

[57] ABSTRACT

An adjustable capacitor is provided on a printed circuit board or hybrid thick film circuit substrate having first and second metallic sheets separated by a sheet or layer of insulating material. The second sheet is provided with an adjustable portion. The second sheet and adjustable portion are divided into two parts by a cut along a first line. These two parts form capacitors with the first sheet. A third capacitor is formed between the two parts, and the value of this third capacitor can be trimmed or adjusted by cuts across the adjustable portion and preferably perpendicular to the first line until the desired value for the third capacitor is reached.

13 Claims, 4 Drawing Figures

FIXED ADJUSTED FLAT CAPACITOR

BACKGROUND OF THE INVENTION

My invention relates to capacitors and to a method for adjusting such capacitors, and particularly to such a capacitor in printed or hybrid thick film circuit form and to a method for adjusting such a capacitor.

Capacitors are frequently provided on printed circuit boards or on hybrid thick film circuit substrates by a first metallic plate on one surface of the board or substrate, and by a second metallic plate on the second and opposite surface of the board or substrate. While this arrangement provides a capacitor between the two plates, it does not provide a capacitor on only one side of the board or substrate.

Accordingly, a primary and general object of my invention is to provide a new and improved arrangement that provides a capacitor on one side of a printed circuit board or on one side of a hybrid thick film circuit substrate in addition to a capacitor between opposite sides of the board or substrate.

Another object of my invention is to provide a new and improved capacitor for a circuit board or substrate.

Another object of my invention is to provide a new and improved method for adjusting a capacitor provided on one side of a printed circuit board or a hybrid thick film substrate.

Another object of my invention is to provide a new and improved capacitor that is located on only one side of a circuit board or substrate for connection to other circuit elements, and that can be adjusted using efficient production techniques.

In some printed circuit or hybrid thick film circuit applications, one or more capacitors (provided between the metallic plates on opposite surfaces of the insulating material) as well as a capacitor (on one side of the plates) may be needed, with means to adjust the capacitor on the one side.

Accordingly, another object of my invention is to provide, for a printed circuit board or hybrid thick film circuit substrate, a new and improved arrangement having a capacitor on one side of the board or substrate that can be adjusted without appreciably affecting the value of the capacitors across the board or substrate.

Another object of my invention is to provide a new and improved capacitor that can have a relatively small capacity that can be independently adjusted or trimmed to a desired value.

SUMMARY OF THE INVENTION

Briefly, these and other objects are achieved in accordance with my invention by an insulating sheet or layer of material having first and second opposing surfaces. A first metallic sheet is provided on the first surface, and a second metallic sheet is provided on the second surface. The second sheet is completely divided along a first cut into two portions to form a first capacitor between the two portions, and to form a second respective capacitor between each of the two portions and the first metallic plate. Each of the two portions includes an adjustable part provided either by a projecting area or by an area partially separated from its respective portions. The adjustable parts are divided along a second cut preferably substantially perpendicular to the first cut so that the remaining length of the two portions along the first cut line provides the desired value for the first capacitor. Since the adjustable part removed by the second cut line is relatively small, the value of the two second capacitors is not appreciably changed. This arrangement and method lend themselves to good and efficient production techniques.

BRIEF DESCRIPTION OF THE DRAWING

The subject matter which I regard as my invention is particularly pointed out and distinctly claimed in the claims. The structure and operation of my invention, together with further objects and advantages, may be better understood from the following description given in connection with the accompanying drawing, in which:

DESCRIPTION OF THE PREFERRED EMBODIMENT

Figure 1:
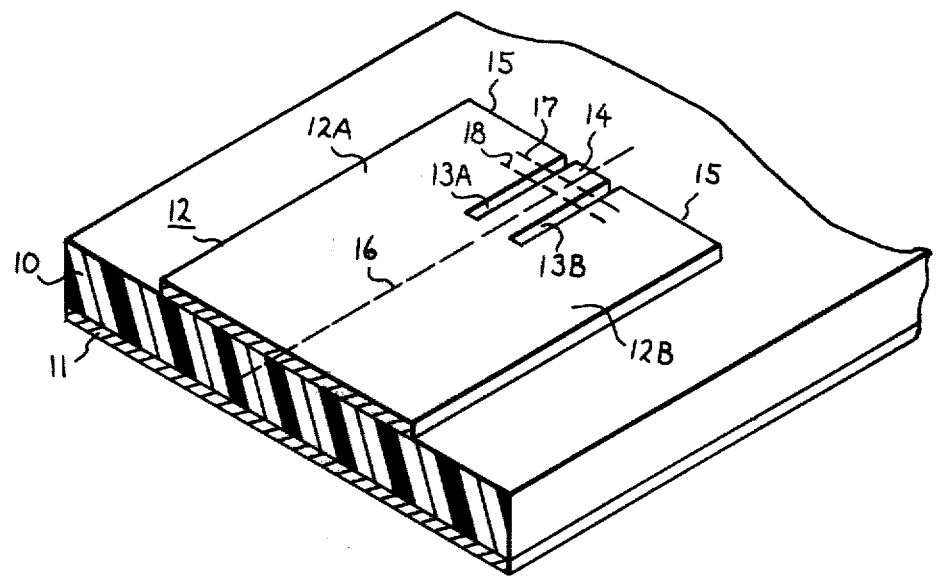
FIG. 1 shows a perspective view of a preferred embodiment of an improved capacitor arrangement in accordance with my invention.

While my invention is applicable to almost any capacitor arrangement provided by metallic conducting sheets on opposing faces of a sheet or layer of insulating material, I contemplate that my invention is particularly useful for arrangements presently known as printed circuit boards, or hybrid thick film circuits. As shown in FIG. 1, such an arrangement includes a layer or sheet 10 of insulating material having substantially flat, parallel, and opposing surfaces. The sheet 10 may be a board or a deposited layer. A first sheet 11 of metallic or conducting material, typically copper, is placed on a first surface of the sheet 10 by any suitable means, such as deposition, or bonding, or cementing. This first sheet 11 generally, but not necessarily, covers the entire first surface of the sheet 10 to form a point of reference potential or ground plane for all of the circuit components placed on the sheet 10. In order that one or more capacitors can be provided on the sheet 10, a second sheet 12 of metallic or conducting material 12 is placed on the second surface of the sheet 10 by any suitable means. The second sheet 12 should overlie the area of the first sheet 11. The thickness of the two sheets 11, 12 is relatively small. As known in the art, a capacitor is formed by the two metallic sheets 11, 12 separated by the insulating (and dielectric) sheet 10. Typically, this capacitor forms a shunt capacitor to ground for any circuit element or lead connected to the sheet 12.

In accordance with my invention, the second metallic sheet 12 is preferably made in the form of a square, since a square usually provides the most efficient use of available space on a circuit board or substrate. I provide two narrow and substantially parallel slits 13A, 13B cut through the thickness dimension and extending (preferably perpendicularly) from one edge 15 of the second sheet 12 toward its center to provide an adjusting portion 14 that is partially separate from the second sheet 12. I prefer that the longest dimension of the adjusting portion 14 be perpendicular to the associated edges 15 of the sheet 12, and that the width of the portion 14 be relatively small for reasons that will be explained.

Figure 2:
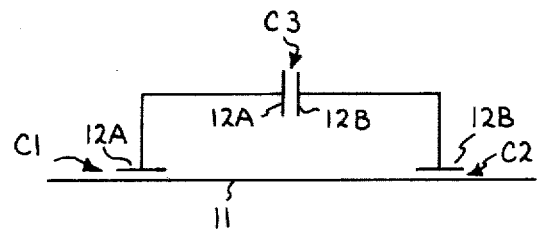
FIG. 2 shows one equivalent electrical circuit of my capacitor arrangement of FIG. 1.

In accordance with my invention, a narrow cut is made along the dashed line 16 parallel to the slits 13A, 13B to divide the second metallic sheet 12 into two halves 12A, 12B. These halves 12A, 12B may either be equal and symmetrical, or may be different, depending upon the desired circuit parameters. This cut can be made by any suitable means, such as a sawing operation, or as I prefer, by what is generally known as laser cutting. At this point, reference is made to FIG. 2 which shows one equivalent electrical circuit diagram of the capacitors which are formed by the operation just described in connection with FIG. 1. In FIG. 2, the elements have been given the same reference numerals as their counterparts in FIG. 1. It will be appreciated that a first capacitor C1 is formed between the sheet 12A and the sheet 11, a second capacitor C2 is formed between the sheet 12B and the sheet 11, and a third capacitor C3 is formed between the sheets 12A, 12B after having been cut in two along the dashed line 16. This third capacitor C3 is provided mainly by the two metallic edge areas (bounded by the length along the line 16 and by the thickness of the sheets 12A, 12B) separated by the narrow cut along the line 16.

Generally, the surface areas of the sheets 12A, 12B can be calculated sufficiently accurately to provide the desired value for the two capacitors C1, C2. Usually the values of these capacitors C1, C2 are sufficiently large so that they are not changed appreciably by the cuts made on the adjusting portion 14 in order to trim or provide the desired value for the third capacitor C3. When the value of the capacitor C3 is to be adjusted or trimmed, a first cut is made along the dashed line 17 which is preferably substantially perpendicular or transverse to the cut line 16. After the cut is made along the line 17, the value of the capacitor C3 may be measured in any suitable manner. I prefer, of course, that the first cut be located so that it does not reduce the capacitor C3 below its desired value. On the assumption that the capacitor C3 is still too large, a second cut can be made along the line 18 positioned between the line 17 and the point of attachment of the portion 14 to the sheet 12. Subsequent cuts along successive lines nearer the point of attachment can be made until the measured value of the capacitor C3 reaches the desired value. If the cuts along the lines 17, 18 penetrate the sheets 12A, 12B slightly, no significant effect results, since the effective areas of the sheets remain essentially unchanged.

As will be appreciated by persons skilled in the art, the value of the capacitor C3 is determined primarily by the areas of the facing edges of the sheets 12A, 12B, and by the stray fields around those edges. The height of these edges is substantially the same as the thickness of the sheet 12, and is fixed after the sheet 12 is selected. The capacitor value is also determined by the separation of the two sheets 12A, 12B, but this becomes fixed after a cut is made along the line 16. Hence, the major variable for the capacitor value is the effective length along the line 16. In accordance with my invention, this value is adjusted as described above by the subsequent cuts along lines transverse to the line 16 until the desired value of capacity is reached. As these subsequent cuts are made, only a very small area of the portion 14 is removed, so that the total area of the sheets 12A, 12B is reduced only slightly and hence the value of the capacitors C1, C2 is not appreciably changed. If desired, the value of the capacitors C1, C2 can be adjusted by removal of a selected area from the total area of the sheet 11.

In one actual embodiment of my invention as described above, the sheet 12 had a thickness of approximately 0.001 inch. The cut along the line 16 separated the sheets 12A, 12B by a distance of approximately 0.002 inch. With these values, I found that the capacity provided between the sheets 12A, 12B was approximately one micromicrofarad for each centimeter of length along the line 16. These figures provided an approximate means of estimating the necessary dimensions, after which trimming could take place along lines parallel to the lines 17, 18 until the capacitor C3 had the desired value. If, as is sometimes the case, the sheets 12A, 12B and the finished board are to be coated, allowance must be made for the dielectric value of the coating material. For example, a typical epoxy will have a dielectric constant of several times that of air, so that after the capacitor C3 is trimmed, this coating in the cut along the line 16 will increase this capacity by a factor of about 1.5. However, this increase can be readily determined by trial and error on sample capacitors to determine the effect of the dielectric coating.

Persons skilled in the art will appreciate that various circuit elements and components can be connected to the sheets 12A, 12B to form any desired electrical circuit. As shown in FIG. 2, my arrangement provides a pi network of capacitors having shunt capacitors C1, C2 and a series capacitor C3. If desired, an electrical input could be connected to the sheet 12A, and an electrical output could be connected to the sheet 12B. If a tuned circuit is desired, a suitable inductor could be provided between each of the sheets 12A, 12B and the sheet 11 respectively. Whatever configuration is used, my arrangement provides a capacitor that is easily manufactured and adjusted using an efficient technique such as a laser device.

Figure 3:
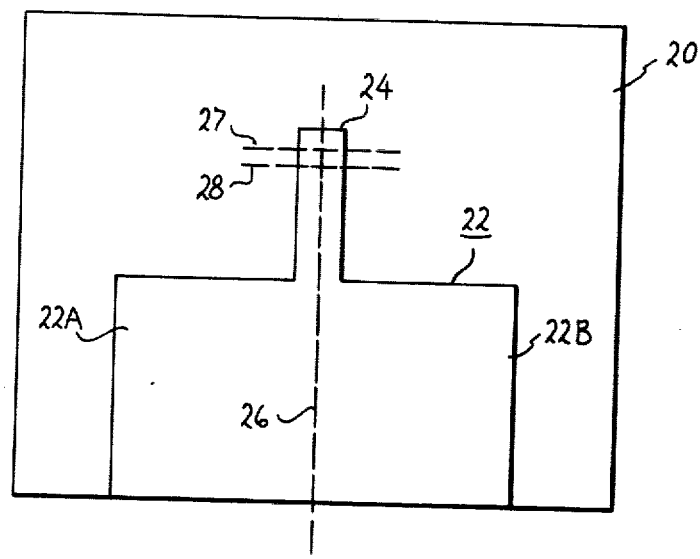
FIG. 3 shows a plan view of a second embodiment of a capacitor arrangement in accordance with my invention.

FIG. 3 shows a plan view of another embodiment of a capacitor arrangement in accordance with my invention. This arrangement comprises a sheet 20 of insulating material having a conductive sheet (not visible) on its bottom surface, and having a conductive sheet 22 on its upper surface. The sheet 22 has a partially separate and projecting adjusting portion 24, rather than a portion formed within the general area of the sheet 22, such as shown in FIG. 1. While the projecting adjusting portion 24 may be desirable in some applications, the portion 24 takes up more space or area on the insulating sheet 20. As described in connection with FIGS. 1 and 2, the sheet 22 is divided into two portions 22A, 22B by a cut along a line 26. After the cut along the line 26 is made, subsequent cuts along a line 27 and if needed a line 28 (and others) can be made across the adjusting portion 24 to provide the desired capacity between the capacitor formed between the portions 22A, 22B.

Figure 4:
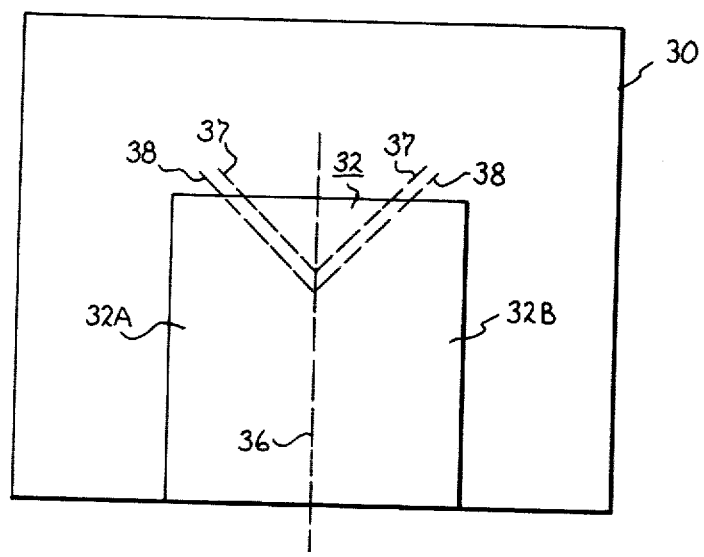
FIG. 4 shows a plan view of a third embodiment of a capacitor arrangement in accordance with my invention.

It will thus be seen that I have provided a new and improved arrangement and method for providing an adjustable capacitor on an insulating sheet of material, such as a printed circuit board, or a hybrid thick film circuit substrate. My arrangement and method permit the capacitor to be readily adjusted or trimmed by efficient techniques, without appreciably affecting the value of other capacitors provided by a spaced sheet of conducting material or ground plane. While I have shown only two embodiments of my invention, persons skilled in the art will appreciate that modifications may be made. For example, if it is found that the capacitors across the insulating material need trimming, parts of the sheets 11, or 12A, 12B, or 22A, 22B may be removed to reduce their area and hence capacity. Likewise, other types of adjusting portions may be made. For example, as shown in FIG. 4, a conducting sheet 32 may be cut along a line 36 into two sheets 32A, 32B. The capacitor so formed may be trimmed by cuts along V-shaped lines 37, 38, with the apex of the V being positioned on the line 36, and with the ends of the V being substantially symmetrical with respect to the line 36. In effect, this removes some of the material from each of the sheets 32A, 32B, which reduces the capacity between the two sheets 32A, 32B. However, I prefer the embodiment shown in FIG. 1, since it occupies a small area and all cuts are made at right angles, rather than along the V-shaped cuts just described. Therefore, while my invention has been described with reference to particular embodiments, it is to be understood that modifications may be made without departing from the spirit of the invention or from the scope of the claims.

What I claim as new and desire to secure by Letters Patent of the United States is:

1. An improved capacitor arrangement comprising:
   a. a sheet of insulating material having first and second opposing surfaces;
   b. a first metallic sheet provided on said first surface;
   c. a second metallic sheet provided on said second surface;
   d. said second metallic sheet being completely divided along a first line into two portions to form a first capacitor between said two portions, and to form a capacitor between each of said two portions and said first metallic sheet respectively;
   e. each of said portions having an adjusting part;
   f. and each of said adjusting parts being divided along a second line positioned at a selected location, and extending in a direction at a substantial angle to said first line.

2. The improved capacitor arrangement of claim 1 wherein said direction of said second line is substantially perpendicular to said first line.

3. The improved capacitor arrangement of claim 1 or claim 2 wherein said adjusting parts are relatively small with respect to said portions.

4. An improved capacitor arrangement comprising:
   a. a sheet of insulating material having first and second opposing surfaces;
   b. a first metallic sheet provided on said first surface;
   c. a second metallic sheet provided on said second surface;
   d. said second metallic sheet being divided along a first line into two separate portions to form a first capacitor between said two portions, and to form a capacitor between each of said two portions and said first metallic sheet respectively;
   e. each of said two portions being partially divided along a respective slit spaced from and substantially parallel to said first line to form an adjustable part between said first line and each of said slits respectively;
   f. and each of said adjustable parts being divided along at least one additional line positioned at a selected location, and extending in a direction at a substantial angle to said first line.

5. The improved capacitor arrangement of claim 4 wherein said direction of said additional line is substantially perpendicular to said first line.

6. The improved capacitor arrangement of claim 4 or claim 5 wherein said adjustable parts are relatively small with respect to said portions.

7. The improved capacitor arrangement of claim 4 or claim 5 wherein said second metallic sheet is substantially rectangular, and wherein said first line and said slits are substantially perpendicular to one edge of said second metallic sheet.

8. The improved capacitor arrangement of claim 6 wherein said second metallic sheet is substantially rectangular, and wherein said first line and said slits are substantially perpendicular to one edge of said second metallic sheet.

9. An improved capacitor arrangement comprising:
   a. a sheet of insulating material having first and second opposing surfaces;
   b. a first metallic sheet positioned on said first surface;
   c. a second metallic sheet positioned on said second surface;
   d. said second metallic sheet including a projecting portion extending on said second surface along a first axis;
   e. said second metallic sheet being divided along said first axis into two portions to form a first capacitor between said two portions, and to form a second capacitor between each of said two portions and said first metallic sheet respectively;
   f. and said projecting portion being divided along a second axis substantially perpendicular to said first axis to provide said first capacitor with a desired value.

10. An improved capacitor arrangement comprising:
    a. sheet of insulating material having first and second opposing surfaces;
    b. a first metallic sheet positioned on said first surface;
    c. a second metallic sheet positioned on said second surface;
    d. said second metallic sheet including an adjustable portion extending along a first axis;
    e. said second metallic sheet being divided along said first axis into two parts to form a first capacitor therebetween, and to form a second capacitor between each of said two parts and said first metallic sheet respectively;
    f. and said adjustable portion being further divided along a second axis substantially perpendicular to said first axis to remove a selected portion from the effective remainder of said adjustable portion and thereby provide said first capacitor with a desired value.

11. An improved capacitor arrangement comprising:
    a. a layer of insulating material having first and second opposing surfaces;
    b. a first metallic sheet provided on said first surface;
    c. a second metallic sheet provided on said second surface;
    d. said second metallic sheet having at least one straight edge and being divided along a first cut that is substantially perpendicular to said one edge into two separate portions to form a first capacitor between said two portions, and to form a capacitor between each of said two portions and said first metallic sheet respectively;
    e. each of said two portions being partially divided along a respective slit that extends from said one edge for a selected distance and that is spaced from an substantially parallel to said first cut to form an adjustable part between said first cut and each of said slits respectively;
    f. and each of said adjustable parts being divided along at least one additional cut positioned at a selected location along said slits, and extending in a direction substantially perpendicular to said first cut.

12. The improved capacitor arrangement of claim 11 wherein said adjustable parts are relatively small with respect to said portions.

13. The improved capacitor arrangement of claim 11 or claim 12 wherein each of said additional cuts extends between said first cut and its respective slit.

* * * * *